US010404250B2

(12) United States Patent
Basler et al.

(10) Patent No.: US 10,404,250 B2
(45) Date of Patent: Sep. 3, 2019

(54) TRANSISTOR DEVICE

(71) Applicant: Infineon Technologies AG, Neubiberg (DE)

(72) Inventors: Thomas Basler, Ottenhofen (DE); Roman Baburske, Otterfing (DE); Johannes Georg Laven, Taufkirchen (DE); Franz-Josef Niedernostheide, Hagen am Teutoburger Wald (DE); Hans-Joachim Schulze, Taufkirchen (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 15/921,893

(22) Filed: Mar. 15, 2018

(65) Prior Publication Data

US 2018/0269872 A1 Sep. 20, 2018

(30) Foreign Application Priority Data

Mar. 16, 2017 (DE) .................. 10 2017 105 713

(51) Int. Cl.
| | |
|---|---|
| *H03K 17/567* | (2006.01) |
| *H01L 27/06* | (2006.01) |
| *H01L 29/16* | (2006.01) |
| *H01L 29/78* | (2006.01) |
| *H03K 17/12* | (2006.01) |
| *H01L 27/088* | (2006.01) |
| *H01L 29/165* | (2006.01) |
| *H01L 29/739* | (2006.01) |
| *H01L 29/778* | (2006.01) |

(Continued)

(52) U.S. Cl.
CPC ....... *H03K 17/567* (2013.01); *H01L 27/0635* (2013.01); *H01L 27/088* (2013.01); *H01L 29/165* (2013.01); *H01L 29/1608* (2013.01); *H01L 29/7393* (2013.01); *H01L 29/7787* (2013.01); *H01L 29/78* (2013.01); *H01L 29/808* (2013.01); *H03K 17/12* (2013.01); *H03K 17/687* (2013.01); *H01L 2924/10272* (2013.01); *H01L 2924/13055* (2013.01); *H01L 2924/13091* (2013.01); *H03K 2217/0036* (2013.01)

(58) Field of Classification Search
CPC .. H03K 17/567; H03K 19/0013; H03K 17/78; H03K 19/177; H03K 19/1776; H03K 17/56; H03K 17/28
See application file for complete search history.

(56) References Cited

U.S. PATENT DOCUMENTS

2014/0185346 A1* 7/2014 Liu .................. H03K 17/127
363/131
2015/0348961 A1 12/2015 Isobe

FOREIGN PATENT DOCUMENTS

| JP | 09252126 A | 9/1997 |
|---|---|---|
| JP | 2000101085 A | 4/2000 |

(Continued)

*Primary Examiner* — John W Poos
(74) *Attorney, Agent, or Firm* — Design IP

(57) ABSTRACT

Transistor devices are described that include a first transistor and a second transistor coupled in parallel between a first terminal and a second terminal. The second transistor is based on a wide bandgap semiconductor material. The second transistor has a breakthrough voltage lower than a breakthrough voltage of the first transistor over a predetermined operating range. The predetermined operating range comprises at least an operating range for which the transistor device is specified.

19 Claims, 5 Drawing Sheets

(51) Int. Cl.
*H01L 29/808* (2006.01)
*H03K 17/687* (2006.01)

(56) References Cited

FOREIGN PATENT DOCUMENTS

| | | |
|---|---|---|
| JP | 2006166655 A | 6/2006 |
| JP | 2014130909 A | 7/2014 |
| WO | 2017029748 A1 | 2/2017 |

* cited by examiner

TRANSISTOR DEVICE

FIELD

The present application relates to transistor devices.

BACKGROUND

In many applications, transistor devices are used. For example, transistor devices may be used as switches in electronic power applications. Various transistor types have been employed as switches, for example bipolar transistors like bipolar junction transistors (BJTs) or insulated gate bipolar transistors (IGBTs), or unipolar transistors like metal oxide semiconductor field effect transistors (MOSFETs). Such transistors and corresponding transistor devices including one or more transistors and possibly additional circuitry are available in different designs to support various voltages and/or currents.

Many electronic power applications operate under partial load over most of the time, and require operation under a maximum load (for example maximum current or power) only part of the time. An example for such an application are switched mode power supplies (SMPS), in which typically during about 80% of the operation time only 20% or less of a maximum power is needed. Nevertheless, such devices have to be designed to tolerate a maximum possible power to prevent failures. Also for higher voltage ranges, for example voltages above 1700 V, many applications exist which switch between full load and partial load, for example converters for solar or wind power plants or application in power trains of vehicles, where for starting of an engine full load is required, whereas, during normal driving only a part of the full power is needed.

Different transistor types may have different drawbacks and advantages when employed in such applications. For example, IGBTs are advantageous for high currents, but under partial load often suffer from a comparatively low efficiency. On the other hand, some unipolar transistor switches like MOSFETs may have a lower efficiency under full load and/or may require large chip areas.

Furthermore, silicon-based IGBTs or other silicon-based transistors may have undesirable properties in terms of overvoltage robustness, i.e. robustness when a voltage is applied exceeding a normal operating voltage. A transistor device having improved properties regarding operation in full load and partial load and with respect to overvoltage tolerance may be desired.

SUMMARY

A transistor device according to claim 1 is provided. The dependent claims define further embodiments of the transistor device as well as a voltage converter comprising such a device.

According to an embodiment, a transistor device is provided that includes a first transistor coupled between a first terminal and a second terminal, and a second transistor coupled in parallel to the first transistor between the first and second terminals, where the second transistor is based on a wide bandgap semiconductor material and is designed to have a lower breakdown voltage than the first transistor for a predetermined operating range including a specified operating range, i.e. an operating range the transistor device is approved by a manufacturer to be operated in. A wide bandgap semiconductor material, as used herein, is a semiconductor material having a bandgap equal to or greater than 2.0 eV, for example, silicon carbide.

According to another embodiment, a voltage converter is provided that includes at least one switch, the at least one switch includes a transistor device as described above.

The above summary is merely intended to give a brief overview over some features of some embodiments and is not to be construed as limiting.

DETAILED DESCRIPTION

Figure 1:
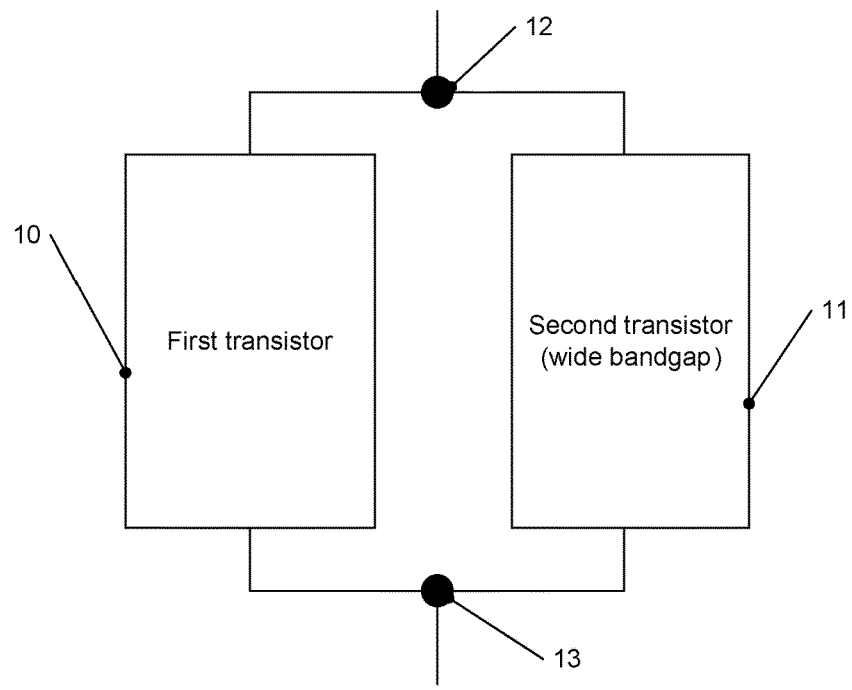
FIG. 1 is a block diagram of a transistor device according to an embodiment.

In the following, various embodiments will be described referring to the attached drawings. It should be noted that these embodiments are given by way of example only and are not to be construed as limiting. For example, while embodiments may be described as comprising numerous features or elements, in other embodiments some of these features or elements may be omitted and/or may be replaced by alternative features or elements. Furthermore, in addition to the features and elements explicitly shown and described, further features or elements as known to persons skilled in the art may be provided.

Features or elements from different embodiments may be combined with each other to form further embodiments. Variations or modifications described with respect to one of the embodiments may also be applied to other embodiments.

In the embodiments discussed and described, any direct electrical connection or coupling between elements, i.e. connection or coupling without additional intervening elements, may also be implemented by an indirect connection or coupling, i.e. a connection or coupling comprising one or more additional intervening elements, and vice versa, as long as the general purpose and operation of the connection or coupling, for example to transmit a certain kind of signal or information or to provide a certain kind of control, is essentially maintained.

In the following, transistor devices will be described. Transistor devices as used herein include one or more transistors. A transistor may be a bipolar transistor (for example using n-doped and p-doped active regions for implementation) or a unipolar (using essentially either only n-type or only p-type active regions for implementation). Examples for bipolar transistors include insulated gate bipolar transistors (IGBTs) having a gate terminal as a control terminal and collector and emitter terminals, or a bipolar junction transistor (BJT) having a base terminal as a control terminal and also emitter and collector terminals. Examples for unipolar transistors include metal oxide semiconductor field effect transistors (MOSFETs) or junction field effect transistors (JFETs), which include a gate terminal as control terminal and source and drain terminals. In some embodiments, a transistor device comprises a parallel circuit of a first transistor and a second transistor. The second transistor is based on a wide bandgap semiconductor material, i.e. a semiconductor material having a bandgap equal to or greater than 2.0 eV, for example silicon carbide (SiC). Other examples include Gallium Nitride (GaN) or Aluminum Gallium Nitride (AlGaN). The second transistor is designed to have a lower breakdown voltage than the first transistor over an operating range (e.g. a range of currents and/or voltages), the operating range including a complete specified operating range, i.e. a range of operating conditions under which the transistor device is intended and guaranteed to be operable by a manufacturer. In some implementations, the first transistor is based on a non-wide bandgap semiconductor material, i.e. having a bandgap below 2.0 eV, for example silicon (Si). In some embodiments, the first transistor is a bipolar transistor like a Si-based IGBT. In some embodiments, the second transistor is a unipolar transistor, for example a SiC-based MOSFET. In other embodiments, the second transistor may be a bipolar transistor like a SiC-based IGBT.

In this respect, semiconductor devices like transistors or transistor devices have certain specifications stating inter alia for which specified operating range, for example temperature range, current range, voltage range they are intended to be operated. Outside this specified range, reliable operation of the semiconductor device is not guaranteed by a manufacturer. Therefore, the specified operation range is a well-defined property for each semiconductor device commercially manufactured.

Turning now to the Figures, FIG. 1 illustrates a schematic block diagram of a transistor device according to an embodiment.

The transistor device of FIG. 1 comprises a first transistor 10 and a second transistor 11 coupled in parallel between a first node 12 and a second node 13. Second transistor 11 in the embodiment of FIG. 1 is based on a wide bandgap semiconductor material, e.g. SiC. First transistor 10 may be based on a non-wide bandgap semiconductor material like Si. "Coupled in parallel" in this case means that one of the emitter or collector terminals or of source or drain terminals of first transistor 10 is coupled to node 12, and the other one of collector or emitter terminal or of source and drain terminal of first transistor 10 is coupled to node 13. Likewise one of emitter or collector terminal or of source or drain terminals of second transistor 11 is coupled to node 12, and the other one of emitter or collector terminal or of source or drain terminals of second transistor 11 is coupled to second node 13. In some implementations, first transistor 10 may be a bipolar transistor like an insulated gate bipolar transistor (IGBT), for example a Si-based IGBT. In some implementations second transistor 11 may be a unipolar transistor like a metal oxide semiconductor field effect transistor (MOSFET). In other embodiments, second transistor 11 may be a bipolar transistor like an IGBT. In some embodiments, second transistor 11 may be a silicon carbide (SiC) based transistor.

In the embodiment of FIG. 1, second transistor 11 has a lower breakthrough voltage than first transistor 10 under a range of operating conditions including a specified operation range for a transistor device shown in FIG. 1. For example, the condition that the breakthrough voltage of second transistor 11 is lower than the breakthrough voltage of first transistor 10 may be valid for a temperature range between −20° C. and 100° C. or −40° C. and 150° C. or 200° C. and/or in a breakdown current range (i.e. current that can be handled after an avalanche breakdown according to a post-avalanche branch of I-V characteristics of the transistor device) up to three or up to five times a nominal current $I_{nom}$ of first transistor 10 and/or second transistor 11. The nominal current is the current a device like first transistor 10 is designed to continuously support.

First transistor 10 and second transistor 11 may have a same voltage class, i.e. may be designed for operation in a same voltage range or up to a same voltage limit (for example up to 100 V, up to 500 V, up to 1400 V, up to 2000 V, up to 3500 V or even up to 6500V or 7000 V etc.).

In such an embodiment, first transistor 10 is protected from overvoltages, i.e. voltages outside a specified range at nodes 12, 13, by second transistor 11. As the breakthrough voltage of second transistor 11 is lower than the breakthrough voltage of first transistor 10, a breakthrough occurs in second transistor 11 before first transistor 10 reaches its breakthrough voltage. The breakthrough of second transistor 11 then reduces the voltage between nodes 12, 13 by a corresponding current flow. As second transistor 11 is based on a wide bandgap semiconductor material, it has a higher tolerance for avalanche currents and breakthrough than e.g. silicon based transistors and is therefore less likely to be damaged by a breakthrough. This will be explained later in more detail referring to FIGS. 3 to 5.

Figures 2A, 2B, 2C:
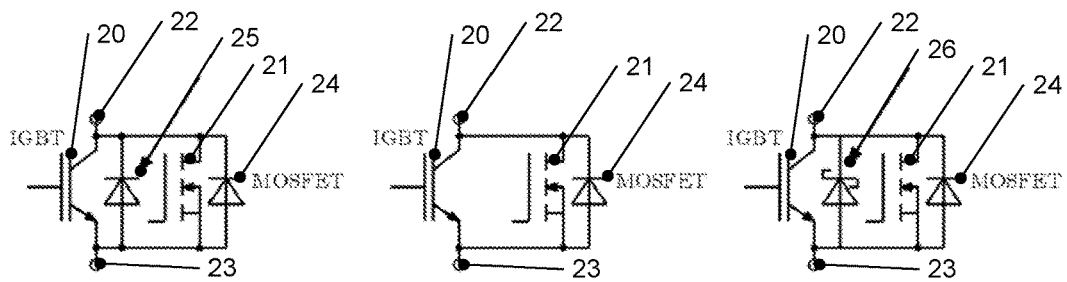
FIGS. 2A to 2C are circuit diagrams illustrating transistor devices according to various embodiments.

Before these explanations, referring to FIGS. 2A to 2C some implementation examples for transistor devices according to embodiments will be discussed. In the embodiments discussed in the following, a unipolar transistor, e.g. a SiC MOSFET, will be used as an example for a second transistor based on a wide bandgap semiconductor material, and a bipolar transistor, e.g. a Si IGBT, is used as an example for a first transistor to be protected by the second transistor. As evident from the above explanations e.g. referring to FIG. 1, this is merely an illustrative example and not to be construed as limiting. In FIGS. 2A to 2C, the same or similar elements bear the same reference numerals and will not be described repeatedly in detail.

The devices of FIGS. 2A to 2C each include an insulated gate bipolar transistor 20 and a metal oxide semiconductor field effect transistor 21 coupled in parallel between a first node 22 and a second node 23. MOSFET 21 in embodiments may be an SiC MOSFET, and IGBT 20 may be a silicon (Si) based IGBT. A MOSFET 21 is provided with an integrated body diode 24.

In FIG. 2B, only IGBT 20 and MOSFET 21 together with integrated body diode 24 are illustrated. In the embodiment of FIG. 2A, additionally a silicon freewheeling diode 25 is provided coupled between nodes 22 and 23, and in the embodiment of FIG. 2C additionally a silicon carbide (SiC) Schottky diode 26 is provided between nodes 22 and 23. Therefore, as can be seen, freewheeling diodes or other circuit elements like Schottky diodes may be provided in addition to IGBT 20 and MOSFET 21.

It should be noted that the embodiments of FIGS. 2A and 2C may be combined, i.e. a silicon freewheeling diode and a silicon carbide Schottky diode may both be provided. Such diodes may serve to reduce oscillations when switching the transistor device in some embodiments.

In some embodiments, for high voltage application peripheral regions of the bipolar transistor (for example IGBT) may be designed to be protected during current commuting processes. In particular, an emitter efficiency in a peripheral region of an IGBT chip may be reduced by a reduced emitter doping or an increased field stop doping compared to a central region.

It should be noted that the IGBT may also be a SiC-based IGBT.

In some embodiments, the IGBT may be a reverse conducting IGBT, i.e. include an integrated freewheeling diode, in particular a so-called reverse conducting diode controlled (RCDC) IGBT. In such RCDC IGBTs, characteristics may be controlled via the gate terminal of the RCDC IGBT also when the RCDC IGBT is in a diode mode (i.e. conducts current essentially via the diode). In some embodiments, such a reverse conducting (RC) IGBT may be not controllable. In such a case, the RC IGBT may be operated both in forward bias mode and freewheeling diode mode as a bipolar device and the unipolar transistor may be operated as a unipolar device in both modes. In such embodiments, control of the transistor device may be simplified.

Figure 3:
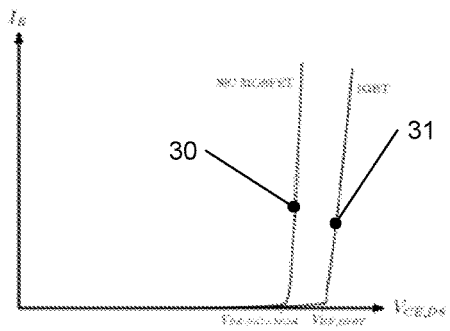
FIG. 3 is a diagram showing example characteristic curves of transistors included in transistor devices according to some embodiments.

FIG. 3 illustrates a breakthrough current or other reverse current $I_R$ for a SiC MOSFET and an IGBT usable in embodiments versus voltage applied over the respective transistor (collector emitter voltage $V_{CE}$ in case of the IGBT and drain source voltage $V_{DS}$ in case of the MOSFET). A curve 30 illustrates the behavior for an SiC MOSFET usable in some embodiments, and a curve 31 illustrates the behavior for an IGBT usable in some embodiments. It should be noted that the curves serve merely for illustration purposes, and the exact shape and form of the curves may vary depending on the implementation of the transistor. The breakthrough current $I_R$ represents a current flowing in case transistors 20, 21 are in an off-state, also referred to as an open state. As can be seen, a breakthrough voltage $V_{BR, \, SiC\text{-}MOS}$ of the SiC MOSFET is lower than a breakthrough voltage $V_{BR, \, IGBT}$ of the IGBT. In case of an overvoltage condition, the breakthrough voltage of SiC MOSFET is reached earlier than the breakthrough voltage of the IGBT, and thus the SiC MOSFET becomes conducting and dissipates the overvoltage before the IGBT may be damaged in some embodiments.

As already mentioned, in embodiments described herein the breakthrough voltage of the unipolar transistor, for example SiC MOSFET, is lower than the breakthrough voltage of the bipolar transistor, for example IGBT, over a broad range of operating conditions including the specified range of operating conditions for the transistor device, for example over a broad range of temperatures. For varying temperatures, this is illustrated in FIG. 4.

Figure 4:
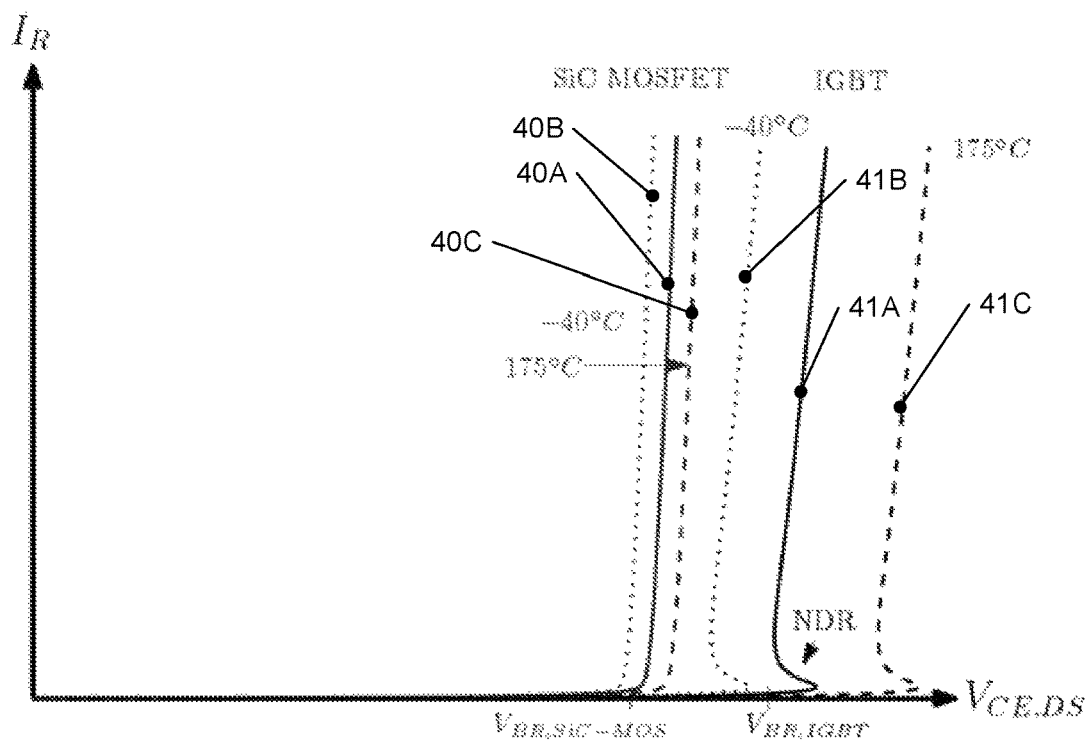
FIG. 4 is a diagram illustrating example characteristic curves of transistors for different temperatures.

FIG. 4 illustrates the breakthrough current $I_R$ versus $V_{CE}/V_{DS}$, similar to FIG. 3. Curves 40A to 40C show the behavior for a SiC MOSFET usable in some embodiments, and curves 41A to 41C illustrate the curves for example IGBT. Again, the specific curves serve merely as non-limiting examples for better illustration.

Curves 40A, 41A illustrate an example behavior at room temperature (e.g. 20° C.), curves 40B, 41B an example behavior at −40° C., and curves 40C, 41C an example behavior at +175° C. As can be seen, the breakthrough voltage for the SiC MOSFET (curves 40A to 40C) is always below the breakthrough voltage for the IGBT (curves 41A to 41C) regardless of temperature. Furthermore, while in the illustrative example of FIG. 4 the curves for the IGBT exhibit a negative differential resistance (NDR), no such NDR is present for the SiC MOSFET. When operated in the NDR region, the respective device may in many cases be destroyed due to a current crowding phenomenon. Finally, the SiC MOSFET in some embodiments, as illustrated in FIG. 4, may be designed to have a smaller temperature variation of its breakthrough voltage than the IGBT and a steeper increase in current with voltage when the breakthrough voltage is exceeded than the IGBT. The lower temperature variations for SiC-based transistors are due to a lower temperature dependency of ionization rates in SiC. This way, protection of the IGBT against overvoltages by the SiC MOSFET is ensured over a large temperature range, for example at least from −40° C. to 175° C. in the example of FIG. 4. This temperature range may vary depending on an application and, as mentioned, covers a specified temperature range, i.e. a temperature range the transistor device is designed for.

In some implementations, by implementing the unipolar transistor device as silicon carbide based device, a temperature and current dependency of the breakthrough voltage may be reduced, and higher breakthrough voltage may be obtained. By shielding of the gate structures from electric fields as described later as a non-limiting example referring to FIG. 9, a comparatively small difference between the breakthrough voltage and a nominal voltage (voltage the SiC MOSFET is designed for) may be achieved (e.g. a difference between 100V and 500V, or less than 10%, 20% or 30% of the nominal voltage) at a predetermined temperature, in particular room temperature (e.g. 20° C.), which facilitates designing the breakthrough voltage of the SiC MOSFET to be lower than the breakthrough voltage of the IGBT or other bipolar transistor, while the SiC MOSFET is still able to operate under a nominal voltage the transistor device is designed for.

Figure 5:
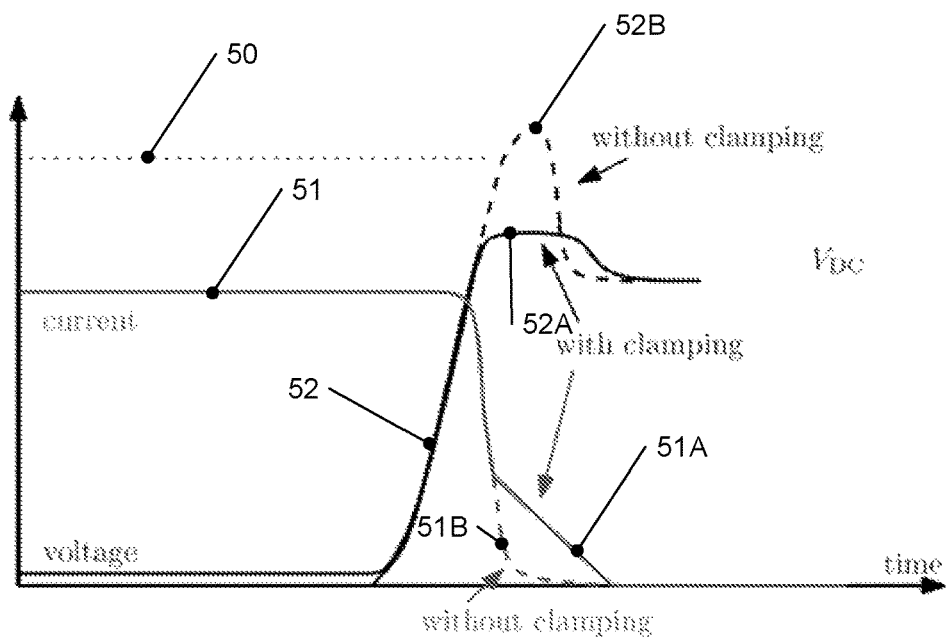
FIG. 5 is a diagram illustrating currents and voltages during a clamping event.

FIG. 5 illustrates the effect of clamping an overvoltage (i.e. reducing the overvoltage by becoming conductive) by the SiC MOSFET to prevent an overvoltage potentially destroying the IGBT. In FIG. 5, a curve 51 illustrates a current flowing via an IGBT in a device according to an embodiment over time, and a curve 52 illustrates a voltage over time. A horizontal line 50 indicates a potentially destructive voltage for the IGBT.

In the example shown, the current 51 drops at some point, for example because the transistors (IGBT and MOSFET) of the transistor device are switched off. This in some configuration, for example through inductivities coupled to the transistor device, may lead to a high voltage across which, as indicated by a curve 52B, may lead to a voltage exceeding the destructive voltage indicated by horizontal line 50, thus potentially damaging the IGBT. With the clamping by an SiC MOSFET, as indicated by a curve 52A, the voltage is decreased such that the limit given by horizontal line 50 is not reached, thus protecting the IGBT. Correspondingly, without the clamping by a SiC MOSFET or other unipolar device, the current drops faster than with the clamping, as indicated by a curve 51A in contrast to a curve 51B.

Without the unipolar transistor like the SiC MOSFET discussed, a slower switching would be necessary to avoid voltage indicated by horizontal line 50, e.g. using a second gate turn-off transistor. Some techniques discussed herein provide a self-protected switching. Therefore, some embodiments as described herein in some cases may enable a faster switching at high currents, which may be desirable for example in motor drive applications, high voltage DC/DC converters which may for example be used as power chargers for electric vehicles or any other applications where overvoltage may be critically, in particular applications where high load variations exist.

As mentioned, while having the properties discussed above, both unipolar and bipolar transistors may have approximately the same nominal voltage (voltage class), which in some embodiments enables a small chip size. The nominal voltage may correspond to a voltage the transistors are actually intended or approved to be used (e.g. 1200V class or 1700V class or up to 6.5 kV class, but not limited thereto).

In some embodiments, additionally a threshold voltage of the unipolar transistor may be lower than a threshold voltage for the bipolar transistor, such that for lower currents most of the current is supported by the unipolar transistor.

Figure 6:
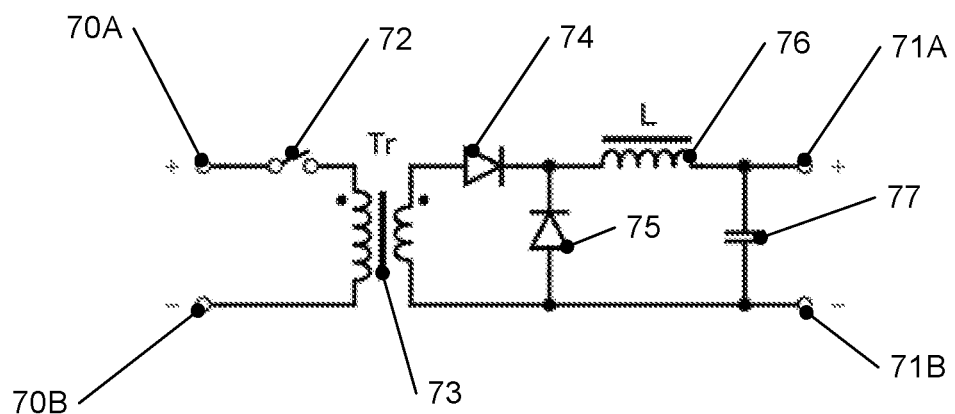
FIG. 6 is a circuit diagram of an example application for transistor devices of some embodiments.

FIG. 6 illustrates an application example for transistor devices according to an embodiment. In particular, FIG. 6 illustrates a simple circuit diagram of a direct current (DC/DC) forward converter with voltage input terminals 70A, 70B and voltage output terminals 71A, 71B. On an input side, a switch 72 switchably couples terminal 70A to a transformer 73. Switch 72 may be designed using a transistor device as discussed above referring to FIGS. 1-6. On an output side, diodes 74, 75, an inductivity 76 and a capacitance 77 are provided.

When switching switch 72 to an off-state, a magnetic field in transformer 73 and/or inductor 76 is dissipated which may lead to high voltages, in particular for fast switching speeds. In such cases overvoltages may occur which may be dissipated using the unipolar transistor of switch 21, thus protecting the bipolar transistor (for example IGBT).

Figure 7:
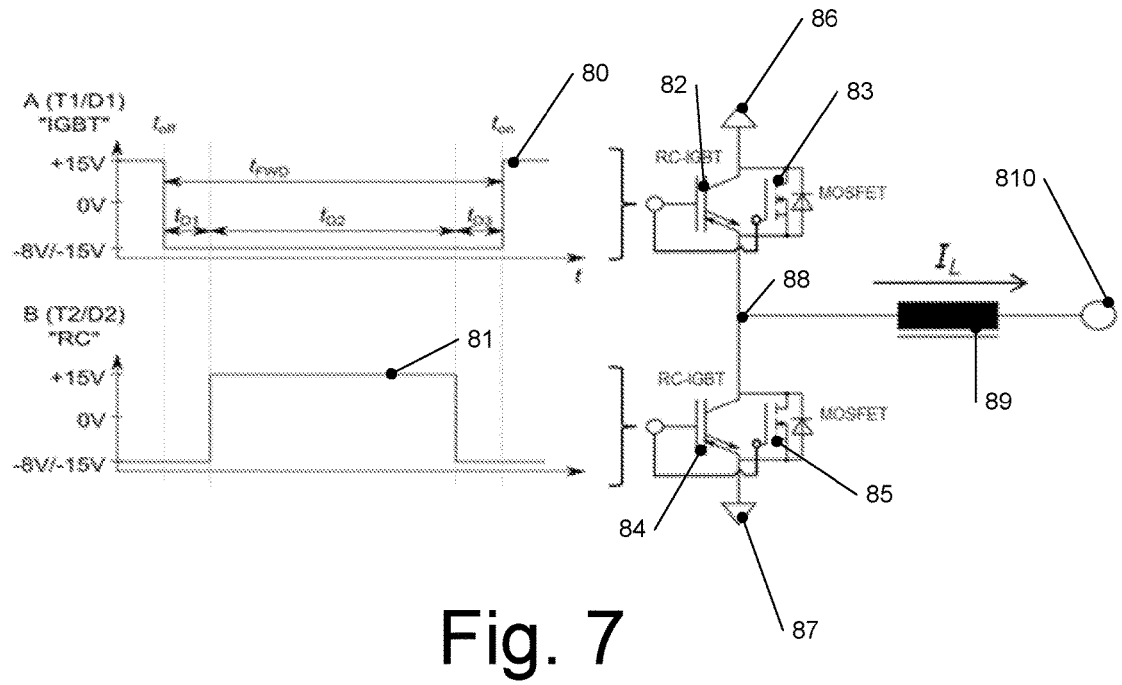
FIG. 7 illustrates an example for controlling transistor devices according to an embodiment.

FIG. 7 illustrates an example for controlling transistor devices according to embodiments. In FIG. 7, a first transistor device comprising an RC-IGBT 82 and a MOSFET 83 is coupled between a first terminal 86, for example a terminal to receive a positive supply voltage, and a node 88. A second transistor device comprising an RC-IGBT 84 and a MOSFET 85 is coupled between node 88 and a second terminal 87, which may for example adapt to receive a negative supply voltage or be coupled to ground. The first and second transistor devices may be implemented as discussed previously. In this way, in the example of FIG. 7 the first transistor device acts a high side switch, and the second transistor device acts a low side switch. RC-IGBT 82 and MOSFET 83 are for example controlled by a signal 80, and a RC-IGBT 84 and MOSFET 85 are controlled by a signal 81, to alternatingly open and close the first transistor device and the second transistor device, to alternatingly couple a load 89 and a terminal 88 to terminal 86 or terminal 87. In the example control signals 80, 81 shown there is a time $t_{d1}$, $t_{d3}$ where both transistor devices are open (off) to prevent a short circuit between terminals 86, 87 when switching. The control scheme illustrated in FIG. 8 and signals 80, 81 serve merely as examples.

Figures 8A, 8B:
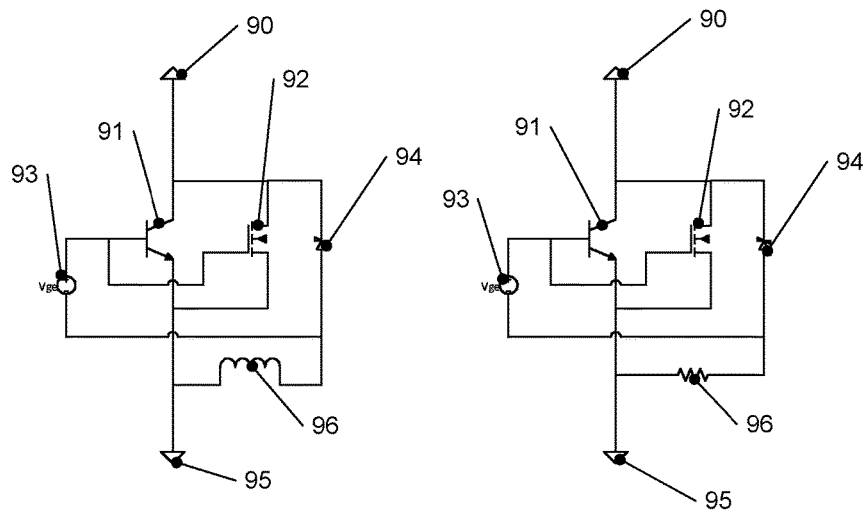
FIGS. 8A and 8B are circuit diagrams showing transistor devices according to some embodiments.

FIGS. 8A and 8B illustrate transistor devices according to further embodiments, including an additional inductive (FIG. 8A) or resistive (8B) gate coupling in a transistor device. The embodiments of FIGS. 8A and 8B each comprise a bipolar transistor 91, for example an IGBT, and a unipolar transistor 92, for example MOSFET (e.g. SiC MOSFET), coupled between a first terminal 90 and a second terminal 95. A control voltage (gate emitter/gate source voltage) Vge generated by a driver 93 controls transistors 91, 92. In FIG. 8A, an additional coupling is provided via an SiC diode 94 and an inductivity 96 (which may for example be realized by bond wires), and in FIG. 8B an additional coupling is realized via SiC diode 94 and a resistor 96. Diode 94 in case of an overvoltage event goes into avalanche breakdown. Therefore, in such an event current is flowing through resistor/inductor 96. By appropriate dimensioning, in this case bipolar transistor 91 may at least partially close to conduct part of the current. Appropriate dimensioning in this case may include designing diode 94 with a lower breakdown voltage than bipolar transistor 91 and unipolar transistor 92. Otherwise, the considerations for the design of transistors 91, 92 for example with respect to breakthrough voltages and threshold voltages discussed referring to FIGS. 1-7, are also applicable to FIGS. 8A and 8B.

Figure 9:
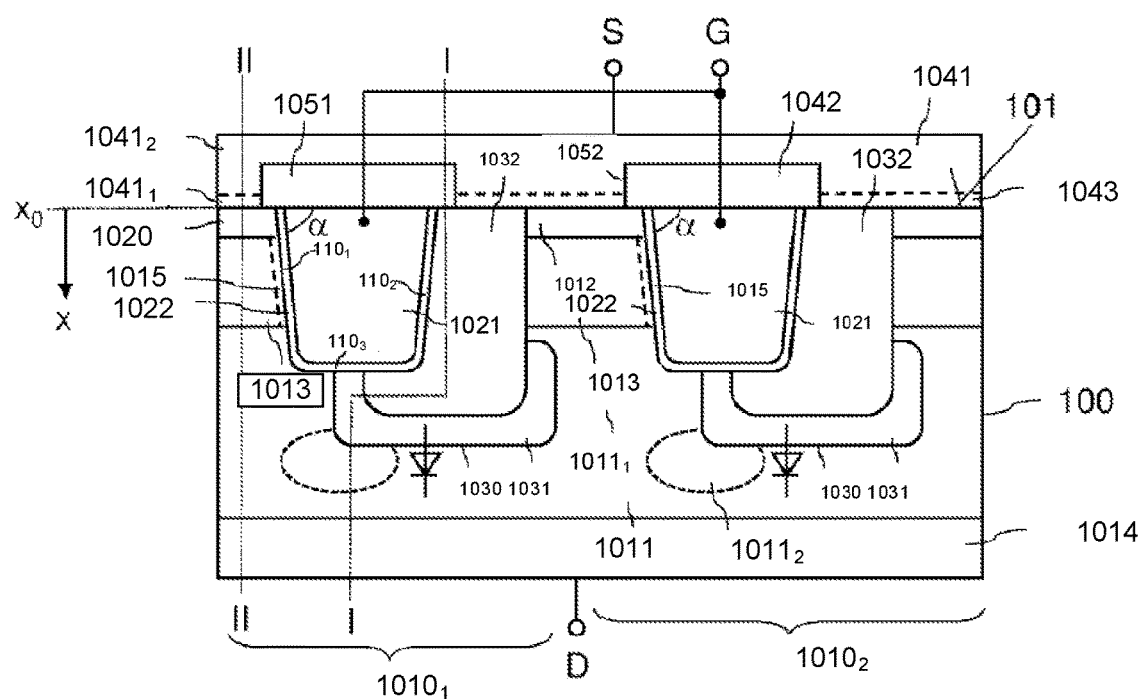
FIG. 9 is a cross-sectional view of a transistor usable in some embodiments.

FIG. 9 illustrates an example implementation of a SiC MOSFET having an integrated diode according to some embodiments. FIG. 9 illustrates a cross-sectional view of a semiconductor structure implementing a MOSFET having a source terminal S, a gate terminal G and a drain terminal D.

The transistor of FIG. 9 comprises a semiconductor body 100 having a first surface 101. Device 100 comprises two transistor cells $1010_1$, $1010_2$, although more than two device cells may be provided. Each transistor cell $1010_1$, $1010_2$ comprises a drift region 1011, a source region 1012 and a body region 1013. Body region 1013 is arranged between source region 1012 and drift region 1011. Each transistor cell $1010_1$, $1010_2$ further comprises a diode region 1030 and a PN junction between diode region 1030 and drift region 1011. In the embodiment of FIG. 9 the two transistor cells $1010_1$, $1010_2$ share drift region 11.

Each transistor cell $1010_1$, $1010_2$ comprises a trench gate electrode 1021, which is arranged in a trench and which is electrically isolated by a gate dielectric from body region 1013, diode region 1030 and drift region 1011. The trench gate electrode 1021 of each transistor cell includes a first side wall $110_1$, a second side wall $110_2$ and a bottom $110_3$. The body region 1030 of each transistor cell is adjacent to a first side wall $110_1$ of the respective trench, diode region 1030 is adjacent to the respective second side wall $110_2$ of the respective trench and the PN junction between drift region and diode region 1030 is adjacent to the bottom $110_3$ of the respective trench.

Diode region 1030 of each transistor cell extends from a first surface 101 of semiconductor body 100 adjacent to a source area 1012 and body region 1013 of an adjacent transistor cell. An electrically isolating layer 1051 covers the first surface 101 and gate electrodes 1021. Isolation layer 1051 includes contact opening 1052, in which diode region 1032 and source 1012 of the individual transistor cells are free of isolation layer 1051. A source electrode 1041 is provided on isolation layer 1051 and in contact openings 1052. Source electrode 1041 is electrically isolated with respect to gate electrode 1021 by isolation layer 1051 and couples the various diode areas 1030 and the various source regions 1012 electrically to source terminal S. Drain region 1014 is coupled to drain terminal D. First transistor cell is generally labelled $1010_1$ in FIG. 9 and second transistor cell is labelled $1010_2$.

Source electrode 1041 may comprise a first source electrode layer $1041_1$ and a second source electrode layer $1041_2$ in some embodiments.

In case of a MOSFET, drain region 1014 has a same doping type (N or P) as source region 1012 and drift region 1011. Diode regions 1030 have a same doping type as body regions 1013 and a different doping type from drift region 1011. In some embodiments, each diode region 1030 has two differently doped semiconductor regions, namely a first region 1031 adjacent to drift region 1011 and forming the PN junction with drift region 1011 and a second region 1032 which couples first region 1031 to source electrode 1041. Second region 1032 may have a higher doping concentration than first region 1031.

In embodiments, region 1031 provides a shielding. Through this shielding, it is possible to implement the device of FIG. 9 in small dimensions with thin layers, which may cause a breakthrough voltage to be close to a nominal voltage without overly stressing gate dielectric 1022. For example, a silicon carbide MOSFET having a nominal voltage of 1200 V and a breakthrough voltage 1300 V may be designed in such a manner, although depending on the design the voltages may vary.

It should be noted that the transistor design of FIG. 9 is merely an example, and other transistor designs may also be used to obtain unipolar and bipolar transistors having desired characteristics as discussed above, in particular the unipolar transistor having a lower breakthrough voltage than the bipolar transistor in a predetermined range comprising a specified range, as discussed.

For example, in some implementations, the IGBT may be implemented with locally highly p-doped regions at a backside thereof to implement a high p-emitter esp. at higher currents. Depending on the lateral dimensions of these highly p-doped regions this can result in an improved softness during turn-off or an improved short-circuit ruggedness.

Further, in some embodiments, the bipolar transistor (e.g. IGBT) and/or the unipolar transistor (e.g. MOSFET) may be compensation devices, i.e. may include regions where e.g. an n-doping is compensated by regions of (e.g. columns of) p-doping or vice versa. As an example, the unipolar transistor may be a superjunction MOSFET.

The following embodiments are example embodiments.

EXAMPLE 1

A transistor device includes a first transistor coupled between a first terminal and a second terminal, and a second transistor coupled in parallel to the first transistor between the first and second terminals, wherein the second transistor is based on a wide bandgap semiconductor material and is designed to have a lower breakthrough voltage than the first transistor for a predetermined operating range including a specified operating range for the transistor device.

EXAMPLE 2

The device of example 1, where the first transistor has a same nominal voltage as the second transistor.

EXAMPLE 3

The device of example 1, where the predetermined operating range includes a temperature range from at least −20° C. to at least 100° C.

EXAMPLE 4

The device of example 3, where the predetermined operating range includes a temperature range from at least −40° C. to at least 200° C.

EXAMPLE 5

The device of example 1, wherein the predetermined operating range includes a current range under a breakdown condition up to at least three times a nominal current of the device.

EXAMPLE 6

The device of example 5, where the current range which can be tolerated under the breakdown condition up to at least five times the nominal current.

EXAMPLE 7

The device of example 1, where a threshold voltage of the first transistor is higher than a threshold voltage of the second transistor.

EXAMPLE 8

The device of example 7, where a difference between the threshold voltage of the first transistor and the threshold voltage of the second transistor is at least 3 V.

EXAMPLE 9

The device of example 8, where the difference is at least 5 V.

EXAMPLE 10

The device of example 1, where a difference between the breakthrough voltage of the second transistor and a nominal voltage of the second transistor at a predetermined temperature is less than 30% of the nominal voltage.

EXAMPLE 11

The device of example 1, where the first transistor includes a bipolar transistor.

EXAMPLE 12

The device of example 1, where the first transistor is based on a non-wide bandgap semiconductor material.

EXAMPLE 13

The device of example 1, where the first transistor has a reduced doping at a peripheral area of a chip backside.

EXAMPLE 14

The device of example 1, where the second transistor includes unipolar transistor.

EXAMPLE 15

The device of example 1, where the second transistor includes a bipolar transistor.

EXAMPLE 16

The device of example 1, where the wide bandgap semiconductor material includes silicon carbide.

EXAMPLE 17

The device of example 1 further comprises a freewheeling diode coupled between the first and second terminals.

EXAMPLE 18

The device of example 1 further includes a silicon carbide diode coupled between the first terminal and the second terminal.

EXAMPLE 19

A direct current/direct current voltage converter includes at least one switch, where the at least one switch includes a transistor device of example 1.

EXAMPLE 20

The device of example 19, where the at least one switch is coupled to a transformer.

In view of the many variations and alternatives described above, it is clear that the above embodiments serve merely as illustrative examples and are not to be construed as limiting.

What is claimed is:

1. A transistor device comprising:
a first transistor coupled between a first terminal and a second terminal; and
a second transistor coupled in parallel to the first transistor between the first terminal and the second terminal, wherein the second transistor is based on a wide bandgap semiconductor material and is configured to have a breakthrough voltage that is lower than a breakthrough voltage the first transistor for a predetermined operating range including a specified operating range for the transistor device,
wherein a difference between the breakthrough voltage of the second transistor and a nominal voltage of the second transistor at a predetermined temperature is less than 30% of the nominal voltage.

2. The transistor device of claim 1, wherein the first transistor has a same nominal voltage as the second transistor.

3. The transistor device of claim 1, wherein the predetermined operating range comprises a temperature range from at least −20° C. to at least 100° C.

4. The transistor device of claim 1, wherein the predetermined operating range comprises a temperature range from at least −40° C. to at least 200° C.

5. The transistor device of claim 1, wherein the predetermined operating range comprises a breakdown current range under a breakdown condition up to at least three times a nominal current of the transistor device.

6. The transistor device of claim 1, wherein the predetermined operating range comprises a breakdown current range under a breakdown condition up to at least five times a nominal current of the transistor device.

7. The transistor device of claim 1, wherein a threshold voltage of the first transistor is higher than a threshold voltage of the second transistor.

8. The transistor device of claim 7, wherein a difference between the threshold voltage of the first transistor and the threshold voltage of the second transistor is at least 3 V.

9. The transistor device of claim 7, wherein the difference between the threshold voltage of the first transistor and the threshold voltage of the second transistor is at least 5 V.

10. The transistor device of claim 1, wherein the first transistor is a bipolar transistor.

11. The transistor device of claim 1, wherein the first transistor is based on a non-wide bandgap semiconductor material.

12. The transistor device of claim 1, wherein the first transistor has a reduced doping at a peripheral area of a chip backside.

13. A transistor device comprising:
a first transistor coupled between a first terminal and a second terminal; and
a second transistor coupled in parallel to the first transistor between the first terminal and the second terminal, wherein the second transistor is based on a wide bandgap semiconductor material and is configured to have a breakthrough voltage that is lower than a breakthrough voltage the first transistor for a predetermined operating range including a specified operating range for the transistor device,
wherein the second transistor is a unipolar transistor.

14. The transistor device of claim 1, wherein the second transistor is a bipolar transistor.

15. The transistor device of claim 1, wherein the wide bandgap semiconductor material comprises silicon carbide.

16. The transistor device of claim 1, further comprising:
a freewheeling diode coupled between the first terminal and the second terminal.

17. The transistor device of claim 1, further comprising:
a silicon carbide diode coupled between the first terminal and the second terminal.

18. A direct current/direct current voltage converter comprising:
at least one switch, wherein each switch of the at least one switch comprises a transistor device,
wherein each transistor device comprises:
a first transistor coupled between a first terminal and a second terminal; and
a second transistor coupled in parallel to the first transistor between the first terminal and the second terminal, wherein the second transistor is based on a wide bandgap semiconductor material and is configured to have a breakthrough voltage that is lower than a breakthrough voltage the first transistor for a predetermined operating range including a specified operating range for the transistor device,
wherein a difference between the breakthrough voltage of the second transistor and a nominal voltage of the second transistor at a predetermined temperature is less than 30% of the nominal voltage.

19. The device of claim 18, wherein the at least one switch is coupled to a transformer.

* * * * *